United States Patent [19]

Wimmer

[11] 4,275,368
[45] Jun. 23, 1981

[54] EMC-/EMI-FILTER MODULE

[75] Inventor: Josef Wimmer, Regenstauf, Fed. Rep. of Germany

[73] Assignee: Siemens Aktiengesellschaft, Berlin & Munich, Fed. Rep. of Germany

[21] Appl. No.: 68,221

[22] Filed: Aug. 20, 1979

[30] Foreign Application Priority Data

Sep. 25, 1978 [DE] Fed. Rep. of Germany ... 7828515[U]

[51] Int. Cl.³ .......................... H03H 7/00; H03H 7/09
[52] U.S. Cl. .................................. 333/167; 333/177; 333/185
[58] Field of Search .................................. 333/167-185

[56] References Cited

U.S. PATENT DOCUMENTS 3,721,747  3/1973  Renskers ........................ 333/185

OTHER PUBLICATIONS

Seiler et al.-"Schnittstellenfilter Für Daten-und Signalleitungen", Siemens-Zeitschrift 51, 1977, pp. 620-624.

Primary Examiner—Marvin L. Nussbaum
Attorney, Agent, or Firm—Hill, Van Santen, Steadman, Chiara & Simpson

[57] ABSTRACT

An EMC-/EMI-filter module for use with unscreened data and signal lines comprises a LC filter utilizing a quadruple inductance is contained in a 16 terminal dual-in-line package with a specified raster dimension.

1 Claim, 2 Drawing Figures

EMC-/EMI-FILTER MODULE

BACKGROUND OF THE INVENTION

1. Field of the Invention

The present invention relates to a filter module, and in particular an EMC-/EMI-filter module contained in a dual-in-line package.

2. Description of the Prior Art

In the design of branched individual networks of data and signal processing blocks, the use of symmetrical systems is increasingly regarded as a particularly suitable design basis. The ever increasing cost considerations in connection with such systems generally prohibit the use of a screened line control, particularly in the systems requiring a large number of terminals or measuring and positioning circuitry and the extensive cabling associated therewith. In order to cut the high costs of such systems, one would ideally utilize unscreened multi-wire lines of telephone, teleprinter or telex networks which are simple to install for data and signal lines up to several hundred thousand bits per second.

The use of such unscreened multi-wire lines presents two problems which must be overcome before such lines can be used with reliable results in most symmetrical systems. First, the line must have electromagnetic compatibility (EMC), i.e., the unscreened, electrically open system cannot be influenced by stray electromagnetic interference fields. Second, the lines must also exhibit radio interference suppression (EMI), i.e., the system or line itself can be permitted to emit high frequency electromagnetic energy at 10 kHz only within the legally permitted levels.

A particularly suitable filter for achieving the above ends is described in Siemens publication 51 (1977), Volume 8, page 621. The circuit consists basically of a number of matched LC filters utilizing a quadruple choke. This filter provides an interface between the line and the processing apparatus which matches in a highly symmetrical fashion the respective signal outputs and inputs to the lines. The particular filter described in the publication is designed for use with two symmetrical signal circuits.

SUMMARY OF THE INVENTION

A particularly suitable filter circuit for interfacing a signal line and symmetrical processing apparatus is comprised of LC filters utilizing a common quadruple choke. In an embodiment for transmitting two symmetrical signal circuits, such as a transmitter and a receiver has two pairs of inputs each of which is bridged by a respective balancing capacitor and each input is further connected to an inductance and a capacitor in series to ground, with an output tap between the inductor and capacitor.

A dual-in-line package embodying the above circuit utilizes a quadruple terminal choke so that partial currents resulting from the signal compensate each other. A high degree of attenuation of the unsymmetrical voltage component with insignificant attenuation of the symmetric signal flow is achieved.

DESCRIPTION OF THE PREFERRED EMBODIMENTS

Figure 1:
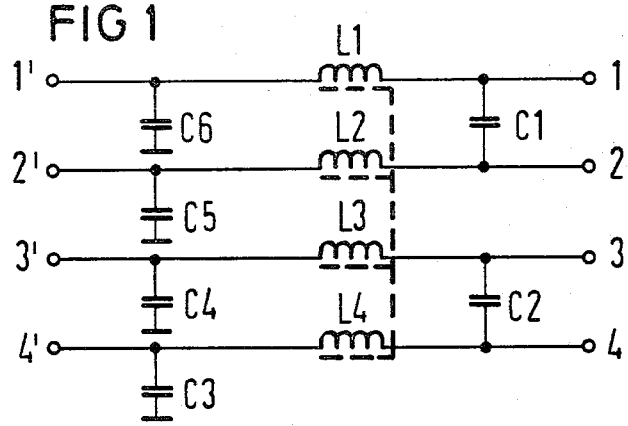
FIG. 1 is a circuit diagram of a LC filter for interfacing two symmetrical signal circuits.

A filter circuit for use in interfacing unscreened multi-wire signal lines to symmetrical processing systems is shown in FIG. 1. The circuit is known from Siemens publication 51 (1977), Volume 8, page 621. The particular embodiment shown is designed for interfacing two symmetrical signal circuits with the respective branches between terminals 1 and 1' and between terminals 2 and 2' for the transmission line, and the respective branches between the terminals 3 and 3' and between the terminals 4 and 4' for the receiving line.

Figure 2:
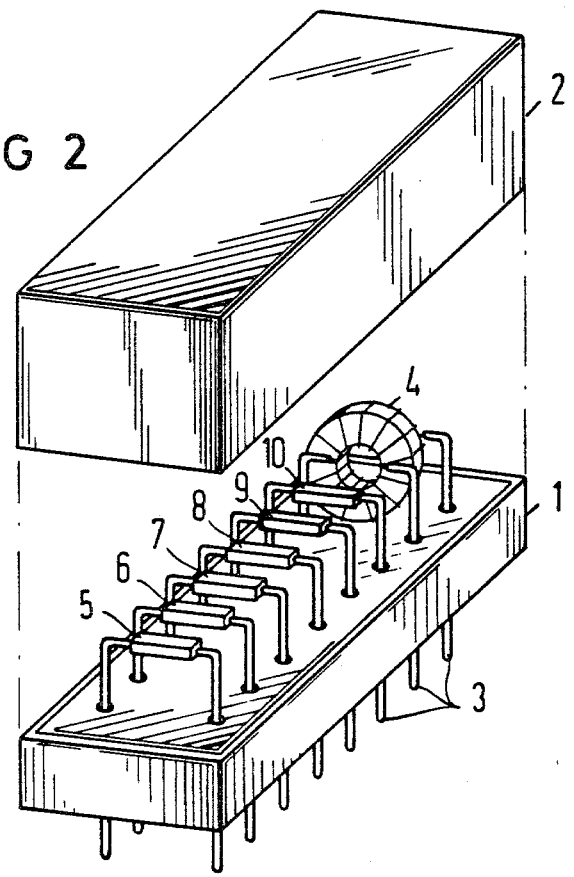
FIG. 2 is a dual-in-line package embodying the circuit of FIG. 1 constructed in accordance with the principles of the present invention.

Each branch contains an inductance, respectively referred to in FIG. 1 as L1, L2, L3 and L4. As shown in FIG. 2, the inductances represented in FIG. 1 are actually produced by one inductor 4 which has the windings around a core such that the partial currents resulting from the signals compensate each other. The core material is therefore loaded by a small portion of the useful current which results only because of interference current and the unavoidable leakage or stray inductance current. Through a homogenously reproducable winding construction, the leakage inductance is limited to approximately 0.1 percent. The low magnetic load of the core permits high inductances having an unsymmetrical effect. A high degree of attenuation of the unsymmetrical voltage component can thus be achieved. The symmetrical signal flow is inductively attenuated only to a negligible degree.

Each branch of the circuit shown in FIG. 1 is further comprised of one capacitor, respectively labeled C6, C5, C4, and C3 in FIG. 1. Each capacitor is connected to ground with the tap for the respective terminals 1', 2', 3' and 4' taken between the inductance and capacitance in each circuit.

Operating in conjunction with the choke 4, the capacitors C3 through C6 provide a further reduction of the unsymmetrical voltage component in the high frequency range. A balancing capacitor C1 connected between the terminals 1 and 2, and a second balancing capacitor C2, connected between the branches 3 and 4 contribute to improved symmetry or balancing of the branches in the low frequency and mid-frequency ranges.

In equipping printed circuits with any components, including filter modules, it is desirable to insert the components in a manner so as to facilitate easy substitution and interchange of components. A housing for the circuit shown in FIG. 1 embodied in a module of this type is shown in FIG. 2.

The module of FIG. 2 consists generally of a 16 terminal dual-in-line package with a specified raster dimension, in particular a raster dimension of 2.54 mm. If the overall height of the module is 10 mm, use of the above raster dimension results in a plug-in raster dimension of 10 mm.

The module of FIG. 2 consists of a carrier body 1 having a housing or cover 2 which can be fixed in place to cover the internal components after insertion thereof. The module has 16 terminals 3 and has contained internally a plurality of capacitors 5, 6, 7 and 8 therein, representing the grounded capacitors of FIG. 1 and additional capacitors 9 and 10 representing the balancing capacitors C1 and C2.

The core of the choke 4 is preferably a high permeable ferrite single aperture core (toroidal core) on which a winding of four-ply parallel wire is applied.

By the use of a ferrite single aperture core with the current-compensated circuit unsymmetrical inductances up to approximately 10 mH with a nominal current of 0.1 A can be produced because the winding of quadruple parallel wire limits leakage or stray inductances of 0.1 percent.

In order to accommodate the number of capacitors in the small volume available in the filter module it is preferable to utilize ceramic multi-layer-chip capacitors. The use of such capacitors renders possible a maximum capacitance with the smallest construction area. Such capacitors also exhibit the necessary dielectric strength such as required by the standards set by VDE 0804 (Vorschriftenwerk Deutscher Elektrotechniker, i.e., Regulations Bureau of German Electronic Engineers) which is 300 VAC/75 V-, 1 min.

It is also possible for all or some of the capacitors to be integrated on a single ceramic substrate by which the module assembly can be even further simplified.

Although modifications and changes may be suggested by those skilled in the art it is the intention of the inventor to embody within the patent warranted hereon all changes and modifications as reasonably and properly come within the scope of his contribution to the art.

I claim as my invention:

1. An EMC-/EMI-filter module for interfacing unshielded data and signal lines with a symmetrical processing device comprising four branches, each branch consisting of an LC filter, the inductance for each branch being formed by a quadruple choke having a highly permeable ferrite single aperture core on which a winding of four-ply parallel wire is wound, said four-ply parallel wire having ends respectively connected to said branches, the capacitor for each said branch being formed of a ceramic multi-layer chip capacitor, all of said branches being contained in a sixteen terminal dual-in-line package having a selected raster dimension.

* * * * *